(12) United States Patent
Takabe et al.

(10) Patent No.: US 7,712,878 B2
(45) Date of Patent: May 11, 2010

(54) LIQUID EJECTING HEAD AND METHOD FOR MANUFACTURING THE SAME

(75) Inventors: Motoki Takabe, Shiojiri (JP); Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 12/057,672

(22) Filed: Mar. 28, 2008

(65) Prior Publication Data

US 2008/0239017 A1  Oct. 2, 2008

(30) Foreign Application Priority Data

Mar. 29, 2007  (JP) .............................. 2007-089867

(51) Int. Cl.
*B41J 2/045* (2006.01)
(52) U.S. Cl. ...................................... 347/68
(58) Field of Classification Search .................. 347/68, 347/70–72; 400/124.14–124.16
See application file for complete search history.

(56) References Cited

U.S. PATENT DOCUMENTS

| 7,216,962 | B2 * | 5/2007 | Miyazawa et al. ............. 347/68 |
| 7,350,904 | B2 * | 4/2008 | Noguchi et al. ................ 347/72 |
| 7,562,968 | B2 * | 7/2009 | Sumi et al. ..................... 347/68 |

FOREIGN PATENT DOCUMENTS

| JP | 04-179287 | 6/1992 |
| JP | 05-048173 | 2/1993 |
| JP | 11-298062 | 10/1999 |
| JP | 2002-043641 | 2/2002 |
| JP | 2003-081694 | 3/2003 |
| JP | 2005-150491 | 6/2005 |
| WO | 2004/057683 A1 | 7/2004 |

OTHER PUBLICATIONS

Zhang, et al; Pulsed Laser Deposited Lead Zirconate Titanate Thin Films for Micro Actuators; Japanese Journal of Applied Physics, vol. 43(2003) No. 6B Part 1; pp. 3986-3990.

* cited by examiner

*Primary Examiner*—K. Feggins
(74) *Attorney, Agent, or Firm*—Workman Nydegger

(57) ABSTRACT

A liquid ejecting head includes a flow channel substrate having a pressure generating chamber communicating with a nozzle aperture through which liquid is ejected, and a piezoelectric element disposed on one surface of the flow channel substrate. The piezoelectric element includes a common electrode, a piezoelectric layer, and an individual electrode. The piezoelectric layer is made of lead zirconate titanate having a rhombohedral or monoclinic crystal structure preferentially oriented in the (100) plane. The saturated polarization Pm and the residual polarization Pr of the piezoelectric layer satisfy the relationship $33\% \leq 2Pr/2Pm \leq 46\%$.

8 Claims, 10 Drawing Sheets

LIQUID EJECTING HEAD AND METHOD FOR MANUFACTURING THE SAME

BACKGROUND

The entire disclosure of Japanese Patent Application No. 2007-89867, filed Mar. 29, 2007 is expressly incorporated by reference herein.

1. Technical Field

The present invention relates to liquid ejecting heads ejecting liquid and methods for manufacturing the same, and particularly to a method for manufacturing an ink jet recording head that ejects ink droplets through a nozzle aperture communicating with a pressure generating chamber by compressing the ink fed into the pressure generating chamber with a piezoelectric element.

2. Related Art

A type of ink jet recording head ejects ink droplets through a nozzle aperture communicating with a pressure generating chamber part of which is defined by a vibration plate. The ink in the pressure generating chamber is compressed to be ejected by deforming the vibration plate by use of a piezoelectric element. This type of ink jet recording head in practical use may include a longitudinal vibration mode piezoelectric actuator whose piezoelectric element expands and contracts in the axial direction of the element, or a flexural vibration mode piezoelectric actuator. In a known ink jet recording head using a flexural vibration mode piezoelectric actuator, for example, piezoelectric elements are provided for respective pressure generating chambers by cutting a piezoelectric material layer evenly deposited over the entire surface of a vibration plate into portions corresponding to the pressure generating chambers by lithography (Japanese Unexamined Patent Application Publication No. 2005-150491). According to Japanese Unexamined Patent Application Publication No. 2005-150491, the piezoelectric material layer preferably has a crystal structure oriented in the (100) plane or a rhombohedral crystal structure from the viewpoint of producing superior piezoelectric properties.

In such a type of ink jet recording head, unfortunately, repetitive driving of the piezoelectric element may vary the displacement of the piezoelectric element and result in unstable ejection. For example, the amount of ink ejected and the ink ejection speed become unstable. In particular, the displacement of the piezoelectric element is often reduced significantly in an early stage. The reduction of the displacement of the piezoelectric element degrades the printing quality. The same problem can occur in liquid ejecting heads ejecting liquid other than ink as well as ink jet recording heads.

SUMMARY

An advantage of some aspects of the invention is that it provides a liquid ejecting head including a piezoelectric element in which the variation of the displacement is reliably reduced so that stable liquid ejection characteristics can be produced, and a method for manufacturing the same.

According to an aspect of the invention, a liquid ejecting head is provided which includes a flow channel substrate having a pressure generating chamber communicating with a nozzle aperture through which liquid is ejected, and a piezoelectric element disposed on one surface of the flow channel substrate. The piezoelectric element includes a lower electrode, a piezoelectric layer, and an upper electrode. The piezoelectric layer is made of lead zirconate titanate having a rhombohedral or monoclinic crystal structure preferentially oriented in the (100) plane, and the saturated polarization $P_m$ and the residual polarization $P_r$ of the piezoelectric layer satisfy the relationship $33\% \leq 2P_r/2P_m \leq 46\%$.

Since the lead zirconate titanate piezoelectric layer having a rhombohedral or monoclinic crystal structure preferentially oriented in the (100) plane satisfies the relationship $33\% \leq 2P_r/2P_m \leq 46\%$, the variation of the displacement of the piezoelectric element can be reliably reduced in practical use. Accordingly, the liquid ejecting head including such a piezoelectric element can exhibit stable liquid ejection characteristics.

Preferably, the piezoelectric layer has a thickness in the range of 1 to 5 µm. The piezoelectric element including such a thin piezoelectric layer allows the variation of its displacement to be reduced.

According to another aspect of the invention, a method is provided for manufacturing a liquid ejecting head including a flow channel substrate having a pressure generating chamber communicating with a nozzle aperture through which liquid is ejected, and a piezoelectric element disposed on one surface of the flow channel substrate and including a lower electrode, a piezoelectric layer made of lead zirconate titanate having a rhombohedral or monoclinic crystal structure preferentially oriented in the (100) plane, and an upper electrode. In the method, the piezoelectric element is formed on the flow channel substrate. The piezoelectric element is aged by applying a driving signal to the piezoelectric element to operate the piezoelectric element so that the saturated polarization $P_m$ and the residual polarization $P_r$ of the piezoelectric layer satisfy the relationship $33\% \leq 2P_r/2P_m \leq 46\%$. Also, the pressure generating chamber is formed in the flow channel substrate.

In the method, the ageing is performed so that the lead zirconate titanate piezoelectric layer having a rhombohedral or monoclinic crystal structure preferentially oriented in the (100) plane satisfies the relationship $33\% \leq 2P_r/2P_m \leq 46\%$. Consequently, the variation of the displacement of the piezoelectric element can be reliably reduced, and the resulting liquid ejecting head exhibits stable liquid ejection characteristics.

The ageing may be performed with a restraining member restraining the displacement of the piezoelectric element more tightly than the state of the displacement of the piezoelectric element in the practical use. Since the ageing is performed with the displacement of the piezoelectric element restrained more tightly than the state of the displacement in practical use, a higher stress is placed on the piezoelectric element during the ageing than in practical use. Consequently, the residual polarization $P_r$ and the saturated polarization $P_m$ of the piezoelectric layer can be adjusted to satisfy the relationship $33\% \leq 2P_r/2P_m \leq 46\%$ at a low driving voltage (electric field intensity) without applying high load. Consequently, the variation of the displacement of the piezoelectric element can be reliably reduced, and the resulting liquid ejecting head exhibits stable liquid ejection characteristics. In ageing performed at a lower voltage than the voltage applied in practical use, the deformation of the piezoelectric layer is smaller than in practical use, and accordingly, the piezoelectric layer is not cracked by ageing. In addition, ageing performed at a low voltage does not excessively damage the piezoelectric layer.

Preferably, the ageing is performed before forming the pressure generating chamber and the flow channel substrate serves as the restraining member during the ageing. This is a simple method for performing the ageing using only the components of the liquid ejecting head before forming the pressure generating chamber so that the piezoelectric layer satisfies the relationship 33%≦2Pr/2Pm≦46%, and can reduce the variation of the displacement of the piezoelectric element without applying a higher load during ageing than in practical use. Thus, the resulting liquid ejecting head exhibits stable liquid ejection characteristics.

The method may further include forming a protective film so as to partially cover the piezoelectric element after forming the piezoelectric element, and the protective film serves as the restraining member during the ageing. Thus, the ageing for adjusting the piezoelectric layer to satisfy the relationship 33%≦2Pr/2Pm≦46% can be performed by a simple method partially covering the piezoelectric element with the protective film without applying a higher load to the piezoelectric element than the load applied in practical use. Thus, the variation of the displacement of the piezoelectric element can be reduced, and the resulting liquid ejecting head exhibits stable liquid ejection characteristics.

The method may further include forming a recess in the protective film in a region opposing the upper electrode after the ageing. The recess allows the protective film to be left to protect the piezoelectric element from humidity without suppressing the displacement of the piezoelectric element.

In the ageing, preferably, a driving signal is applied to the piezoelectric element so that the ageing is performed at a lower driving voltage than the driving voltage applied in the practical use. Thus, the occurrence of cracks by ageing can be reliably prevented. Since a low voltage is applied, the piezoelectric layer is not excessively damaged.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will now be described in detail with reference to exemplary embodiments.

First Embodiment

Figure 1:
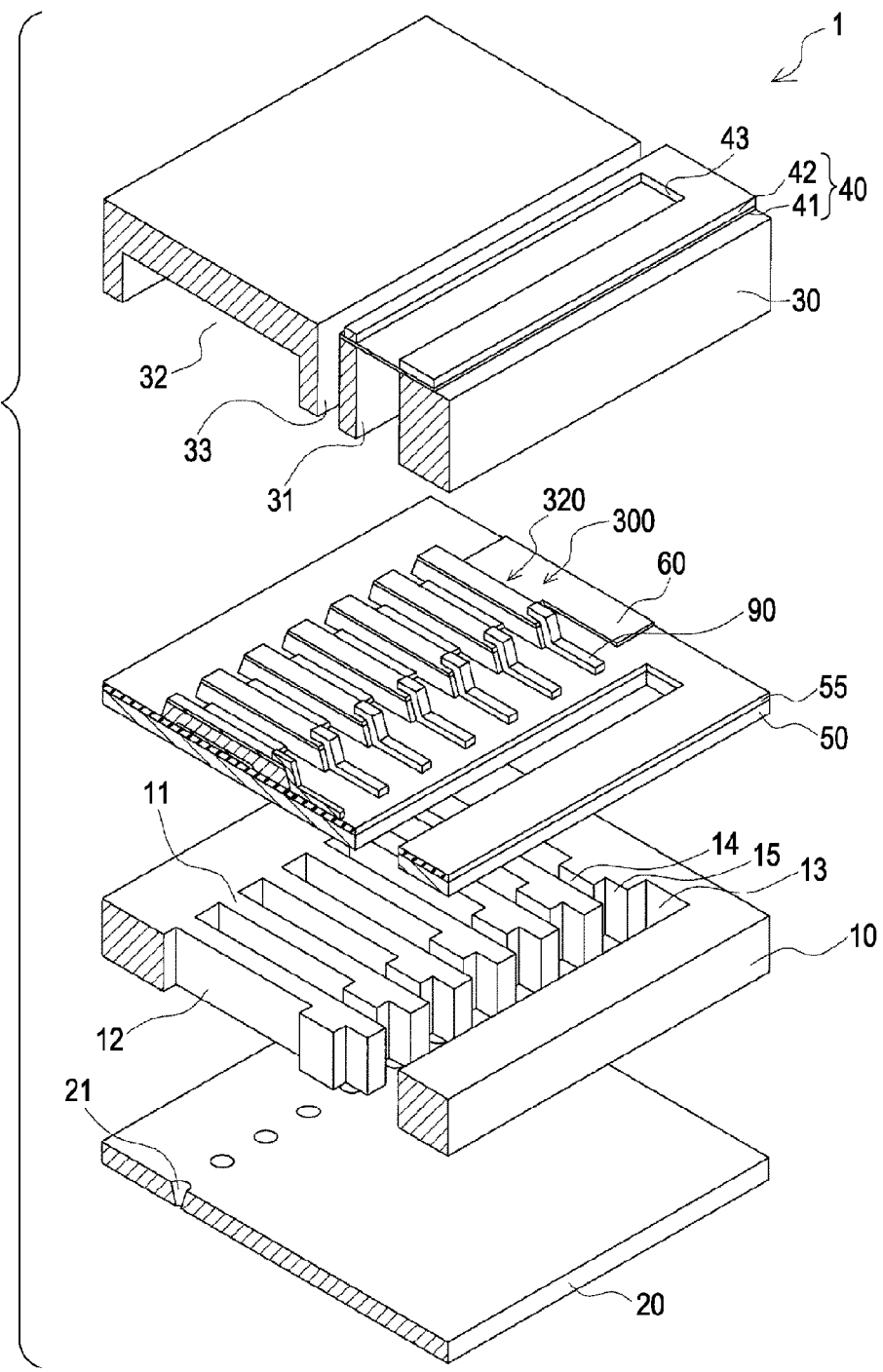
FIG. 1 is an exploded perspective view of a recording head according to a first embodiment of the invention.
Figure 2A:
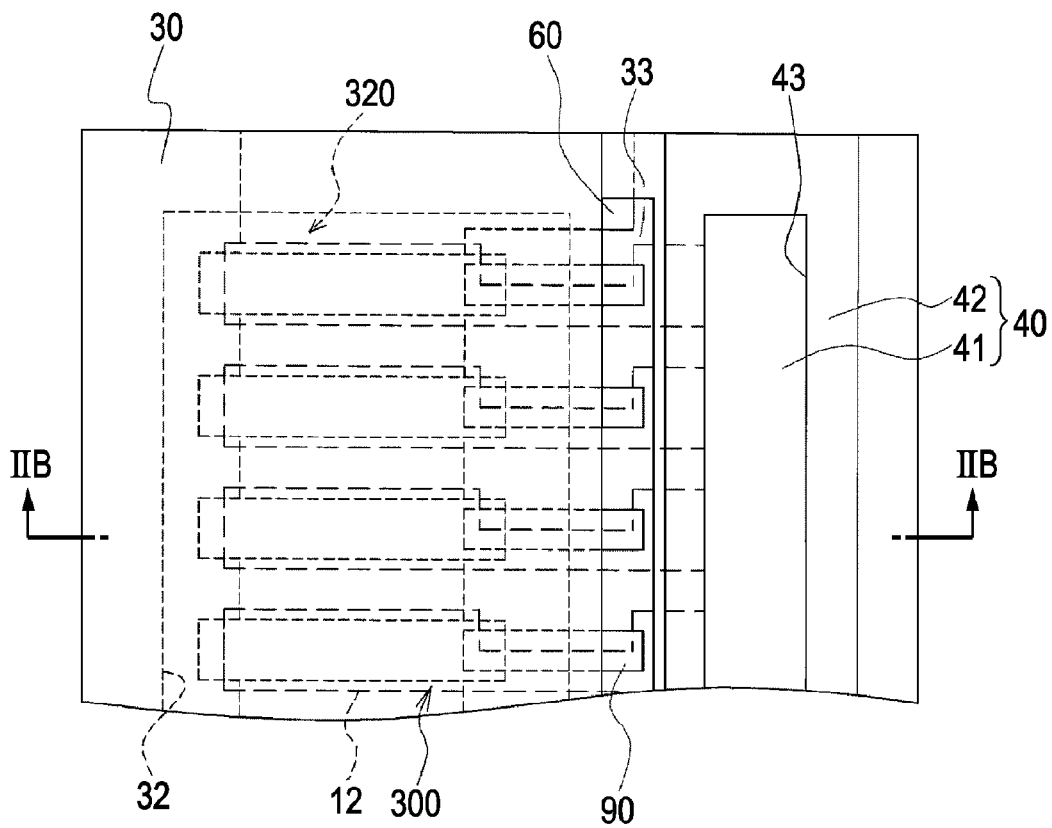
FIG. 2A is a plan view of the recording head according to the first embodiment and FIG. 2B is a sectional view of the recording head.
Figure 2B:
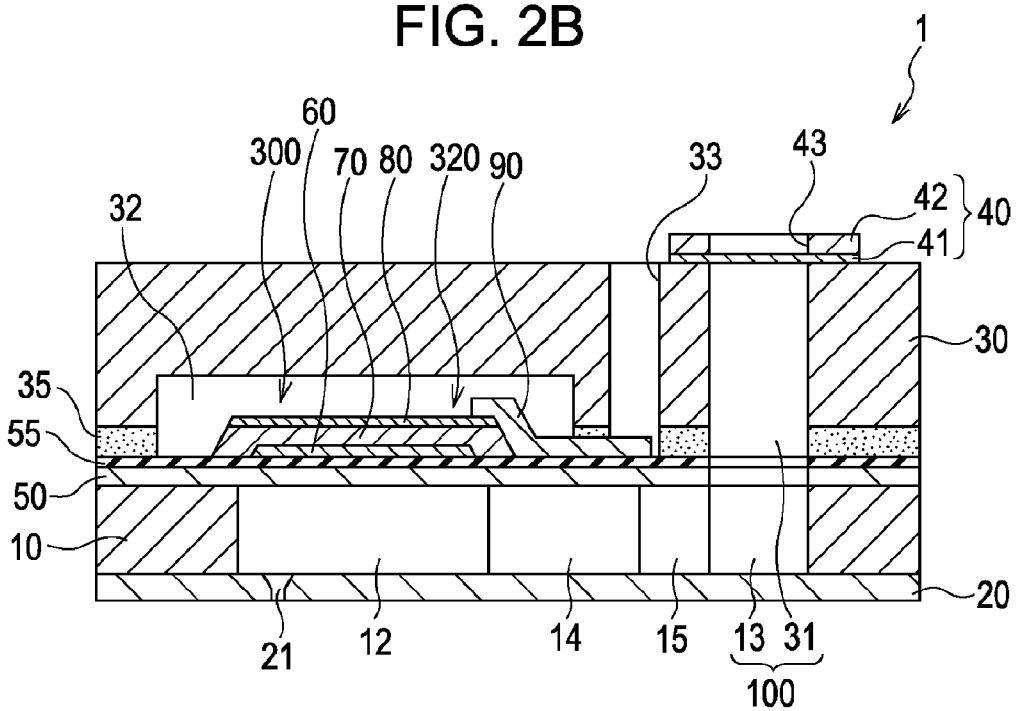

FIG. 1 is an exploded perspective view of a schematic structure of an ink jet recording head 1 according to a first embodiment of the liquid ejecting head of the invention. FIG. 2A is a plan view of the principal parts of the ink jet recording head 1, and FIG. 2B is a sectional view taken along line IIB-IIB of FIG. 2A.

In the first embodiment, a flow channel substrate 10 is made of a silicon single crystal plate whose thickness has a (110) plane orientation, and an elastic film 50 is formed of silicon dioxide to a thickness of 0.5 to 2 μm on one surface of the flow channel substrate 10, as shown in those figures. The flow channel substrate 10 has a plurality of pressure generating chambers 12 formed from the other surface by anisotropic etching. The pressure generating chambers are separated by partition walls 11 and are arranged in parallel in their width direction (shorter length direction). Ink supply channels 14 and communication paths 15 are also formed in the flow channel substrate 10 so as to be defined by the partition walls 11 at one ends in the longitudinal direction of the pressure generating chambers. A communication section 13 is formed on one ends of the communication paths 15 to define part of a reservoir 100 acting as a common ink chamber (liquid chamber) of the pressure generating chambers 12. Thus, the flow channel substrate 10 has liquid flow channels including the pressure generating chambers 12, the communication section 13, the ink supply channels 14, and the communication paths 15.

Each ink supply channel 14 has a smaller cross section than the pressure generating chamber 12 and continues from one end in the longitudinal direction of the pressure generating chamber 12. Each communication path 15 has a larger cross section than the ink supply channel 14 and continues from one end of the ink supply channel 14 opposite to the pressure generating chamber 12. In the present embodiment, the communication path 15 has substantially the same cross section as the pressure generating chamber 12. In other words, the flow channel substrate 10 has the pressure generating chambers 12, the ink supply channels 14 having a smaller cross section than the pressure generating chambers 12, and the communication paths 15 communicating with the respective ink supply channels 14 and having a cross section larger than the ink supply channels 14 and substantially the same as the pressure generating chambers 12. These liquid flow channels are defined by the partition walls 11.

A nozzle plate 20 is bonded to the open side of the flow channel substrate 10 with an adhesive or a heat welding film. The nozzle plate 20 has nozzle apertures 21 communicating with one ends of the respective pressure generating chambers 12 opposite to the ink supply channels 14. The nozzle plate 20 is made of, for example, glass ceramic, single-crystal silicon, or stainless steel.

On the other side of the flow channel substrate 10, opposite the open side, the silicon dioxide elastic film 50 of, for example, about 0.5 to 2 μm in thickness is disposed, as described above. A zirconium oxide ($ZrO_2$) insulating film 55 is formed to a thickness of, for example, about 0.3 to 0.4 μm over the elastic film 50. A lower electrode film 60 of, for example, about 0.1 to 0.5 μm in thickness, a lead zirconate titanate (PZT) piezoelectric layer 70 of, for example, about 1 to 5 μm in thickness having a rhombohedral or monoclinic crystal structure preferentially oriented in the (100) plane, and an upper electrode film 80 of, for example, about 0.05 μm in thickness are formed for the piezoelectric elements 300 in that order on the insulating film 55 by a film-forming process described below. The piezoelectric layer 70 has a saturated polarization Pm and a residual polarization Pr satisfying the relationship 33%≦2Pr/2Pm≦46%, as will be described later in detail. The piezoelectric element 300 refers to a portion including the lower electrode film 60, the piezoelectric layer 70, and the upper electrode film 80. In general, one of the electrode films 60 and 80 of the piezoelectric elements 300 is formed as a common electrode, and the other electrode film and the piezoelectric layer 70 are formed for each pressure generating chambers by patterning. Each portion including the patterned electrode film and the piezoelectric film 70, at which piezoelectric distortion occurs by applying a voltage between both electrodes is referred to as a piezoelectric active portion 320. In the present embodiment, the lower electrode film 60 is formed as the common electrode of the piezoelectric element 300, and the upper electrode film 80 is formed by patterning an electrode layer into individual electrodes of the respective piezoelectric elements 300. The forms and functions of these electrode films may be reversed for the sake of structural convenience of providing a driving circuit or wiring. In either case, the piezoelectric active portions 320 are formed for the respective pressure generating chambers 12. In the present embodiment, the piezoelectric layer 70 and the upper electrode film 80 are patterned in such a manner that the upper electrode film 80 has a smaller width than the piezoelectric layer 70, and thus the patterned portion defined by the piezoelectric layer 70 and the upper electrode film 80 has sloped sides, as shown in FIG. 2B. The piezoelectric elements 300 and a vibration plate in which displacement is produced by operating the piezoelectric elements 300 define an actuator device. The vibration plate is defined by the elastic film 50, the insulating film 55, and the lower electrode film 60 in the present embodiment. However, the vibration plate is not limited to such a structure, and may be defined only by the lower electrode film 60 without providing the elastic film 50 or the insulating film 55. The piezoelectric elements 300 may substantially double as the vibration plate.

The lower electrode film 60 may be formed of a metal such as iridium (Ir) or platinum (Pt), or have a multilayer structure including a plurality of layers made of those metals. The multilayer structure may result in a mixed layer by a subsequent step.

The piezoelectric layer 70 made of a piezoelectric material is disposed on the lower electrode film 60. The piezoelectric layer 70 of the present embodiment is made of lead zirconate titanate (PZT) and has a rhombohedral or monoclinic crystal structure preferentially oriented to the (100) plane. "Preferentially oriented" means a state in which specific crystal planes of a crystal are oriented in substantially the same direction, but not disordered. More specifically, "preferentially oriented in the (100) plane" means that the diffraction intensities of the (100), (110), and (111) planes of a piezoelectric film measured by wide-angle X-ray diffraction satisfy the relationship $$(100)/((100)+(110)+(111))>0.5.$$

Figure 3:
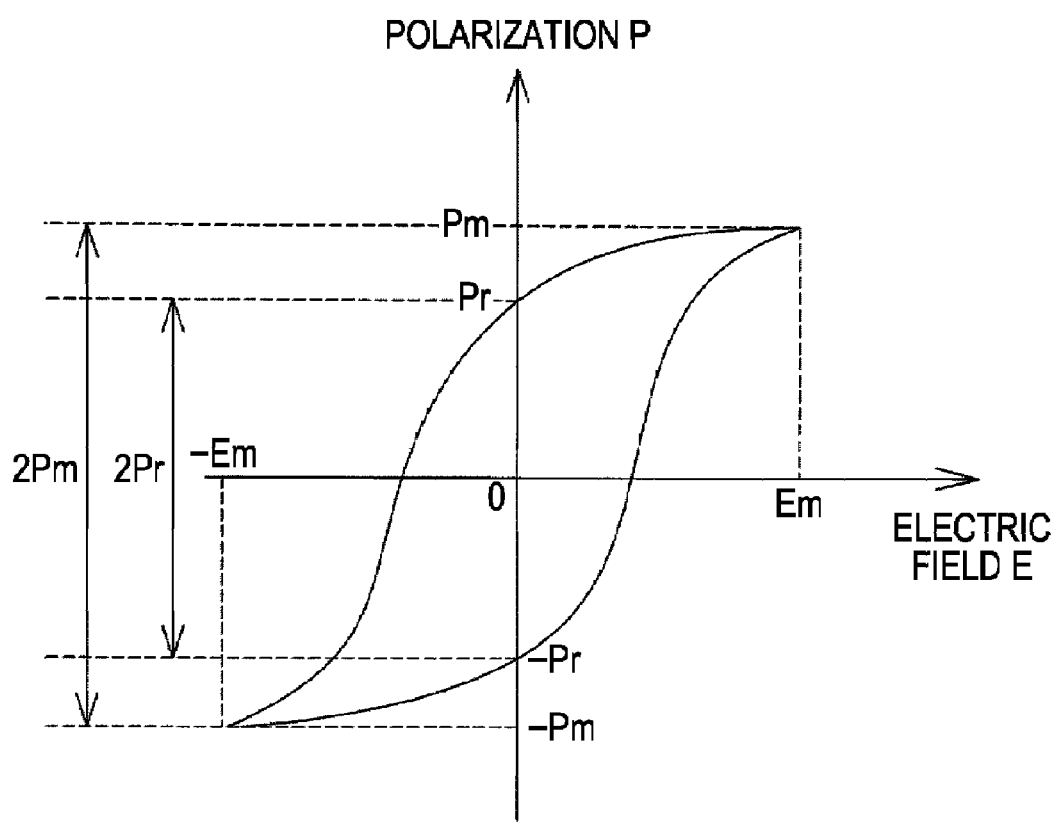
FIG. 3 is a graph of a hysteresis loop of a piezoelectric layer.

In addition, the saturated polarization Pm and the residual polarization Pr of the piezoelectric layer 70 satisfy the relationship 33%≦2Pr/2Pm≦46%. When the polarization of dielectric lead zirconate titanate is measured while the direction and the intensity of an external electric field are varied, a hysteresis loop as shown in FIG. 3 is obtained. The saturated polarization Pm refers to a polarization at a sufficiently high voltage that can produce an electric field intensity (Em) of about 200 to 300 kV/cm, and the residual polarization Pr refers to a polarization at an applied voltage of 0. In the present embodiment, the residual polarization Pr of the PZT piezoelectric layer 70 is specified relative to the saturated polarization Pm.

The use of the PZT piezoelectric layer 70 having a rhombohedral or monoclinic crystal structure preferentially oriented to the (100) plane and satisfying the relationship 33%≦2Pr/2Pm≦46% can reduce the variation of the displacement of the piezoelectric element 300 in the practical use, that is, the difference between the displacements of the piezoelectric element 300 at an early stage of the operation and after repeating a predetermined cycles of the operation. Hence, the ink jet recording heat of the present embodiment can exhibit stable ejection characteristics without variation even after repetitive ejection has been performed.

The relationship between the residual polarization Pr and saturated polarization Pm of the piezoelectric layer 70 and the displacement of the piezoelectric element 300 will now be described. The displacement of the piezoelectric element 300 depends on the displacement of the piezoelectric element 300 when a predetermined driving signal is applied to the piezoelectric element 300 (saturation strain) and the displacement of the piezoelectric element 300 when the driving signal is set at 0 (residual strain). Since the residual strain is increased by repeating the operation of the piezoelectric element 300, the displacement of the piezoelectric element 300 is varied with time by operating the piezoelectric element 300. The reason why the residual strain is increased by operating the piezoelectric element 300 is that the repetitive operation of the piezoelectric element 300 partially fixes the polarization of the piezoelectric material of the piezoelectric layer 70 to produce a residual polarization Pr in the piezoelectric element 300.

The residual strain is reflected on the residual polarization Pr, and the saturation strain is reflected on the saturated polarization Pm. The residual polarization Pr is varied depending on the thicknesses and materials of the layers constituting the piezoelectric element 300, and the saturated polarization Pm is also varied depending of the same factors as the residual polarization Pr, that is, depending on the thicknesses and materials of the layers constituting the piezoelectric element 300. Accordingly, the reduction of the displacement of the piezoelectric element 300 resulting from the increase of the residual strain can be estimated from the relative residual polarization Pr to the saturated polarization Pm. More specifically, when the relative residual polarization Pr to the saturated polarization Pm, 2Pr/2Pm, of the piezoelectric layer 70 at an early stage of the practical use is 33% or more, the reduction of the displacement of the piezoelectric element 300 resulting from the increase of the residual strain can be suppressed effectively, as will be described later in Experimental Examples.

In the present embodiment, the 2Pr/2Pm value of the piezoelectric layer 70 is set at 33% or more at an early stage of the practical use of the ink jet recording head; hence, the piezoelectric layer 70 is prepared in a state in which the residual strain has been increased in advance to prevent the residual strain from increasing in the practical use and thus to prevent the displacement of the piezoelectric element 300 from varying. The fixation of the polarization of the piezoelectric material resulting from repetitive operation of the piezoelectric element 300 is saturated to some extent. Accordingly, the variation of the residual strain can be reduced by increasing the residual strain to some extent in advance.

If the operational conditions and printing quality of the ink jet recording head 1 is optimized according to the ink ejection characteristics before the displacement of the piezoelectric element 300 is varied, the printing quality is degraded due to the variation of the displacement. For example, a reduction of the displacement of the piezoelectric element 300 in the practical use results in varying the ink ejection characteristics, and accordingly the printing quality cannot be maintained at a certain level. "Practical use" used herein means that printing is performed on, for example, print paper by ejecting ink from an ink jet recording head 1. In the present embodiment, the piezoelectric layer 70 having a predetermined crystal structure and satisfying the relationship 33%≦2Pr/2Pm≦46% allows the ink jet recording head 1 to be optimized in advance. Consequently, high printing quality can be maintained.

A piezoelectric layer 70 having a 2Pr/2Pm value of less than 33% increases the variation of the displacement of the piezoelectric element 300 and results in unstable ejection characteristics. A piezoelectric layer 70 having a 2Pr/2Pm value of higher than 46% cannot produce a displacement sufficient to eject ink with desired ejection characteristics. The saturated polarization Pm is preferably in the range of 38.0 to 49.6 μc/cm$^2$ when a piezoelectric layer 70 of about 1.2 μm in thickness is measured with ±35 V triangular waves. A saturated polarization Pm of 38.0 μc/cm$^2$ or more can ensure a displacement of 340 nm or more sufficient for the recording head. A saturated polarization of 49.6 μc/cm$^2$ or less can prevent the vibration plate or the like from being broken by an excessively large displacement.

The upper electrode film 80 is made of a metal, such as platinum (Pt) or iridium (Ir), a multilayer composite or alloy of these metals, as with the lower electrode film 60.

Leading electrodes 90 made of, for example, gold (Au) are connected to the respective upper electrode films 80 acting as the individual electrodes of the piezoelectric elements 300, and extend from the one ends of the individual upper electrodes on the ink supply channel 14 side to the surface of the insulating film 55.

The flow channel substrate 10 having the piezoelectric elements 300 is bonded to a protective substrate 30 with an adhesive 35. The protective substrate 30 has a piezoelectric element retaining section 32 defined by a space formed in the protective substrate 30 in a region opposing the piezoelectric elements 300 to allow the movement of the piezoelectric elements 300. The space of the piezoelectric element retaining section 32 may be closed or open as long as the piezoelectric elements 300 can move.

The protective substrate 30 also has a reservoir section 31 in a region opposing the communication section 13. The reservoir section 31 communicates with the communication section 13 of the flow channel substrate 10 to define the common reservoir 100 for the pressure generating chambers 12, as described above. In addition, a through hole 33 passing through the protective substrate 30 in the thickness direction is formed in the protective substrate 30 between the piezoelectric element retaining section 32 and the reservoir section 31. Part of the lower electrode films 60 and the ends of the leading electrodes 90 are exposed through the through hole 33.

A driving circuit (not shown) driving the piezoelectric elements 300 is secured on the protective substrate 30. The driving circuit is electrically connected to the leading electrodes 90 through electroconductive wires, such as bonding wires.

The protective substrate 30 is preferably made of a material having substantially the same thermal expansion coefficient as the material of the flow channel substrate 10, such as glass or ceramic. In the present embodiment, the protective substrate 30 is made of single-crystal silicon, that is, the same material as the flow channel substrate 10.

A compliance substrate 40 including a sealing film 41 and a fixing plate 42 is bonded on the surface of the protective substrate 30. The sealing film 41 is made of a low-rigidity, flexible material (for example, 6 μm thick polyphenylene sulphide (PPS) film) and seals one side of the reservoir section 31. The fixing plate 42 is made of a hard material, such as a metal (for example, 30 μm thick stainless steel (SUS)). An opening 43 is formed in the fixing plate 42 by completely removing the portion of the fixing plate 42 opposing the reservoir 100. Hence, one side of the reservoir 100 is sealed with only the flexible sealing film 41.

The ink jet recording head 1 having such a structure takes in ink from an external ink supply portion (not shown) to fill the internal spaces from the reservoir 100 to the nozzle apertures 21 with the ink. Then, a voltage is applied between the lower electrode film 60 and the upper electrode films 80 corresponding to the pressure generating chambers 12 according to the recording signal from the driving circuit, thereby deflecting the elastic film 50, the insulating film 55, the lower electrode film 60, and the piezoelectric layers 70. Thus, the pressure in each pressure generating chamber 12 is increased to eject ink droplets through the nozzle aperture 21.

Figure 4A:
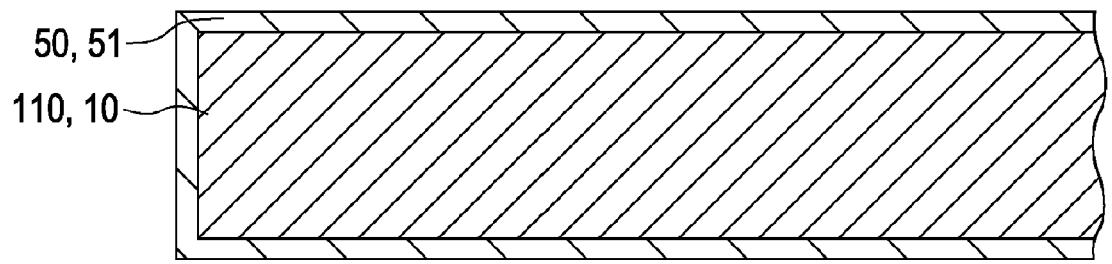
FIGS. 4A to 4C are sectional views of steps in a method for manufacturing the recording head according to the first embodiment.
Figure 4B:
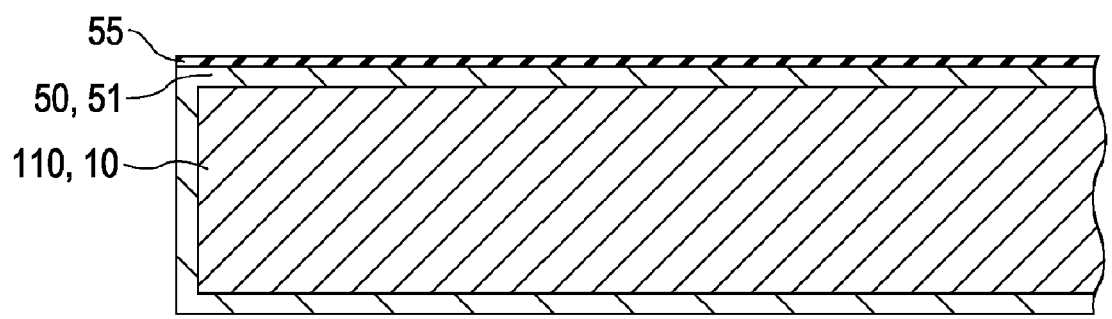

A method for manufacturing the ink jet recording head 1 will now be described with reference to FIGS. 4A to 6C, which are sectional views taken in the longitudinal direction of the pressure generating chamber. As shown in FIG. 4A, a silicon dioxide film 51 intended for the elastic film 50 is formed on the surface of a silicon wafer 110 intended for the flow channel substrate 10. Turning to FIG. 4B, a zirconium oxide insulating film 55 is formed on the silicon dioxide film 51 (elastic film 50).

Figure 4C:
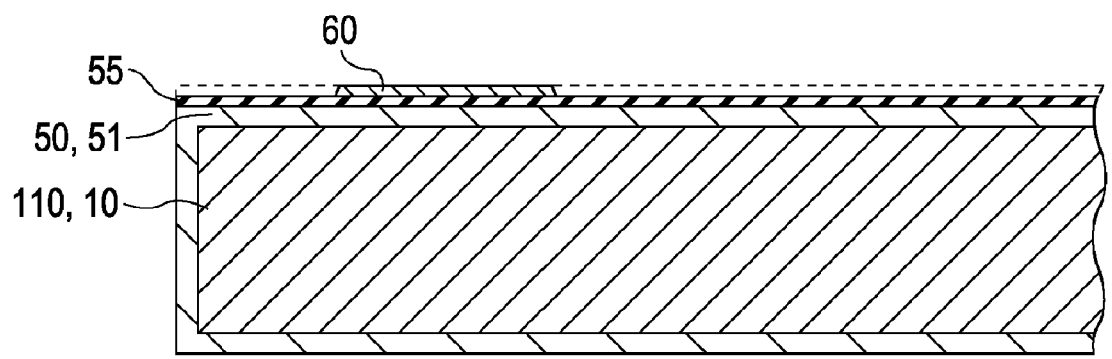
Figure 5A:
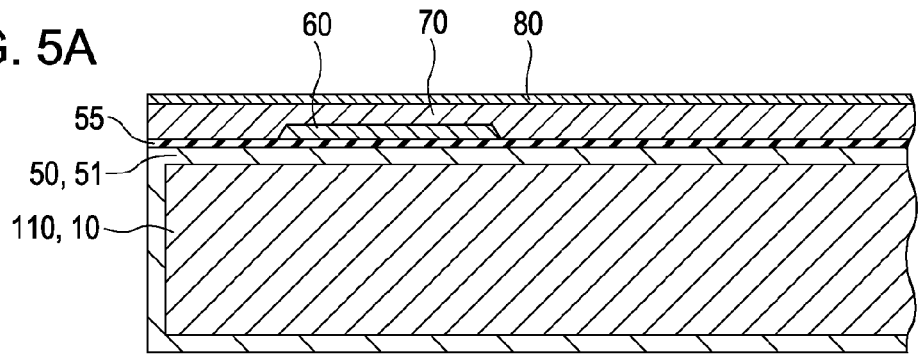
FIGS. 5A to 5C are sectional views of steps in the method for manufacturing the recording head according to the first embodiment.
Figure 5B:
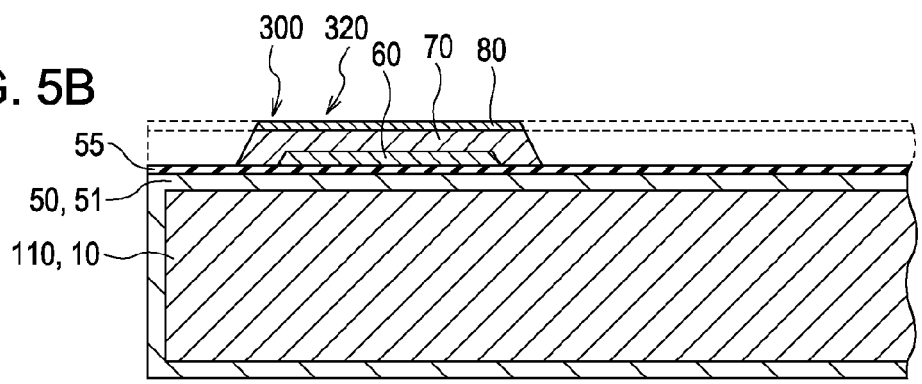
Figure 5C:
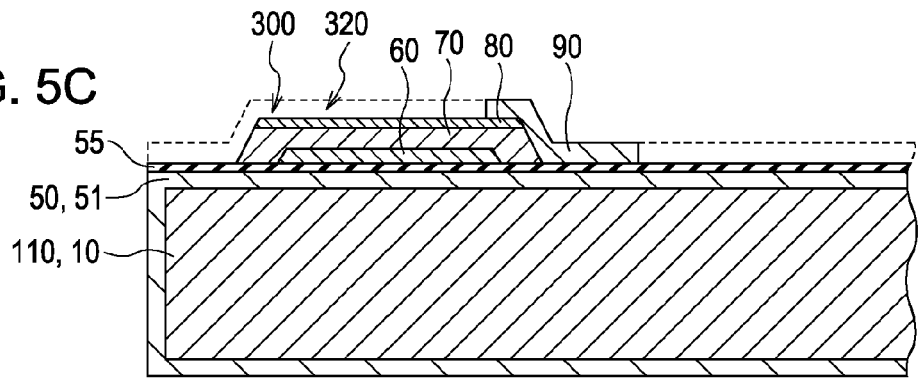

Then, the piezoelectric elements 300 are formed on the insulating film 55. More specifically, as shown in FIG. 4C, a lower electrode film 60 is formed of, for example, platinum over the entire surface of the insulating film 55, followed by patterning into a predetermined shape. Then, a piezoelectric layer 70 made of, for example, PZT and an upper electrode film 80 made of a metal, such as platinum, are deposited in that order, as shown in FIG. 5A, and are subsequently patterned together to form piezoelectric elements 300, as shown in FIG. 5B. Turning to FIG. 5C, a leading electrode layer is formed of, for example, gold (Au) over the entire surface of the flow channel substrate wafer 110 and patterned into leading electrodes 90 corresponding to the respective piezoelectric elements 300. The film-forming process is thus performed. In the present embodiment, the piezoelectric layer 70 is formed by a so-called sol-gel process, in which a sol prepared by dissolving or dispersing an organic metal in a solvent is applied and dried to gelate to form a piezoelectric layer precursor, followed by firing at a high temperature, thus forming a metal oxide piezoelectric layer 70. Alternatively, the piezoelectric layer 70 may be formed by, for example, MOD (Metal-Organic Decomposition) or sputtering without being limited to the sol-gel process. The patterning of the piezoelectric layer 70 and the upper electrode film 80 can be performed together by dry etching through a resist layer having a predetermined shape (not shown). Such dry etching can pattern the piezoelectric layer 70 and the upper electrode film 80 through a resist layer having sloped sides in such a manner that the upper electrode film 80 has a smaller width than the piezoelectric layer 70, and thus the patterned portion defined by the piezoelectric layer 70 and the upper electrode film 80 has sloped sides.

In the present embodiment, a driving signal is applied to the piezoelectric elements 300 in the stage shown in FIG. 5C after forming the piezoelectric elements 300 and before forming the pressure generating chambers 12 to perform ageing at a lower driving voltage than the driving voltage applied in the practical use. By appropriately selecting the ageing conditions including the driving voltage and driving interval, the piezoelectric layer 70 is adjusted to satisfy the relationship $33\% \leq 2Pr/2Pm \leq 46\%$. If a high voltage is applied to the piezoelectric element 300, piezoelectric element 300 is not displaced, or the piezoelectric layer 70 is cracked. Accordingly, the piezoelectric element 300 is operated under conditions that those problems do not occur in the practical use, and the piezoelectric element 300 and the vibration plate are thus deformed to eject ink from the pressure generating chamber 12 through the nozzle aperture 21.

In the present embodiment, a driving signal is applied to the piezoelectric element 300 to operate the piezoelectric element 300 for ageing during the manufacturing process so that the polarization of the piezoelectric material is partially fixed in advance. Thus, the residual strain is increased so that the piezoelectric layer 70 satisfies the relationship $33\% \leq 2Pr/2Pm \leq 46\%$, and thus the displacement of the piezoelectric element 300 is stabilized in the practical use. Although the 2Pr/2Pm value of the piezoelectric layer 70 may be less than 33% before the ageing, it can be appropriately adjusted to satisfy the relationship $33\% \leq 2Pr/2Pm \leq 46\%$ by the ageing.

In the present embodiment, the ageing is performed before forming the pressure generating chambers 12, as described above. Hence, the ageing is performed in a state where the entirety of the bottoms of the piezoelectric elements 300 is bonded to the flow channel substrate wafer 110 (flow channel substrate 10). The flow channel substrate 10 before being provided with the pressure generating chambers 12 corresponds to a restraining member.

When a driving signal is thus applied to the piezoelectric element 300 secured on the flow channel substrate 10 to operate the piezoelectric element 300, the piezoelectric layer 70 is contracting, but the piezoelectric element 300 is secured to the flow channel substrate 10 and cannot move. Thus, the displacement of the piezoelectric element 300 is more restrained by the flow channel substrate 10 during the ageing than in the practical use, in which the piezoelectric element 300 can be deformed because of the presence of the pressure generating chambers 12 formed in the flow channel substrate 10. Consequently, a higher tensile stress than in the practical use is placed on the piezoelectric element 300 during the ageing. The state in which the displacement of the piezoelectric element 300 is more restrained than in the practical use by the restraining member provided to the piezoelectric element 300 is referred to as a restrained state.

Since the polarization of the piezoelectric material can be fixed by performing ageing with a higher tensile stress than in the practical use placed on the piezoelectric element 300, the voltage applied to the piezoelectric element 300 for sufficient ageing can be lower than that the voltage applied in the practical use.

The piezoelectric layer 70 is less deformed than in the practical use by the ageing performed at a lower voltage than the voltage applied in the practical use. Accordingly, the variation of displacement of the piezoelectric element 300 can be reduced without forming a crack in the piezoelectric layer 70 during the ageing. Thus, the resulting ink jet recording head can exhibit stable ink ejection characteristics. Since the deformation of the vibration plate is also reduced more than in the practical use, the vibration plate can be prevented from cracking during the ageing. In addition, ageing performed at a low voltage can prevent the piezoelectric layer 70 from being excessively damaged, and thus eliminate the problem that the piezoelectric element 300 cannot be displaced. Furthermore, the ageing time can be reduced, and accordingly the load on the piezoelectric element 300 can be reduced by performing the ageing in a shorter time. Also, since a member of the ink jet recording head 1 before being formed into the final form used in the ink jet recording head 1, such as the flow channel substrate 10 before being provided with the pressure generating chambers 12, is used for the ageing, additional members are not required, and ageing can be performed more efficiently than ever. The driving signal applied to the piezoelectric elements 300 may be direct or alternating current, or may be pulsed. For example, the waveform of the driving signal preferably has a single frequency, such as a sinusoidal wave or a rectangular wave. In any case, the ageing conditions are adjusted so that the piezoelectric layer 70 satisfies the relationship $33\% \leq 2Pr/2Pm \leq 46\%$.

Since the present embodiment performs the ageing before forming the pressure generating chambers 12 in the flow channel substrate 10, the tensile stress placed on the piezoelectric element 300 by the flow channel substrate 10 is used for the ageing. Consequently, a sufficient ageing can be performed at a lower voltage than the voltage applied in the practical use.

Figure 6A:
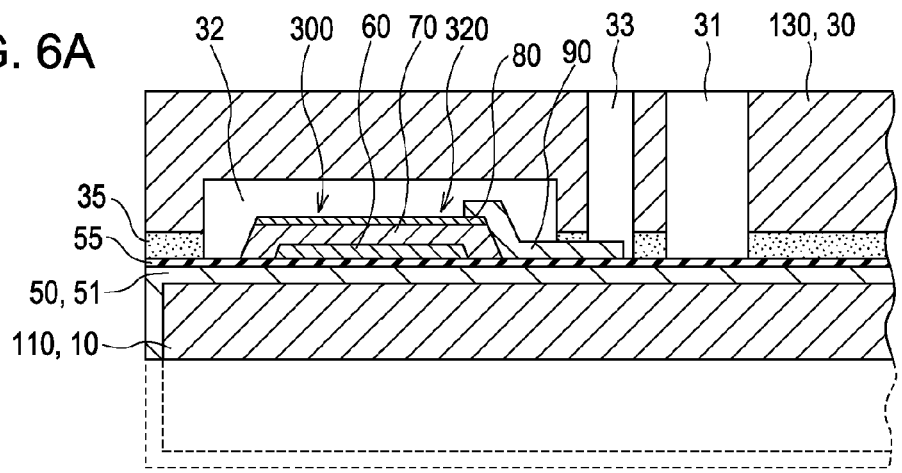
FIGS. 6A to 6C are sectional views of steps in the method for manufacturing the recording head according to the first embodiment.
Figure 6B:
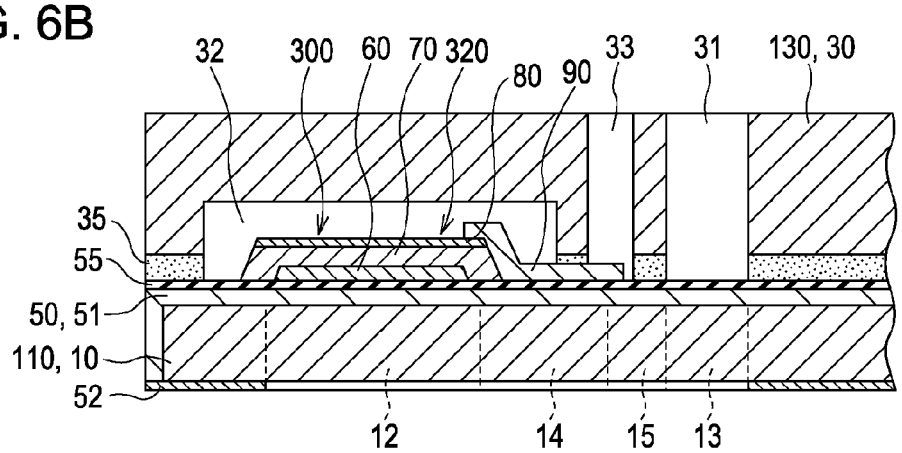

After the ageing, a silicon protective substrate wafer 130 intended for a plurality of protective substrates 30 is boned to the surface of the flow channel substrate wafer 110 having the piezoelectric elements 300 with an adhesive 35, as shown in FIG. 6A. Then, the thickness of the flow channel substrate wafer 110 is reduced to a predetermined thickness. Subsequently, a mask layer 52 is formed on the flow channel substrate wafer 110 and patterned into a predetermined shape, as shown in FIG. 6B.

Figure 6C:
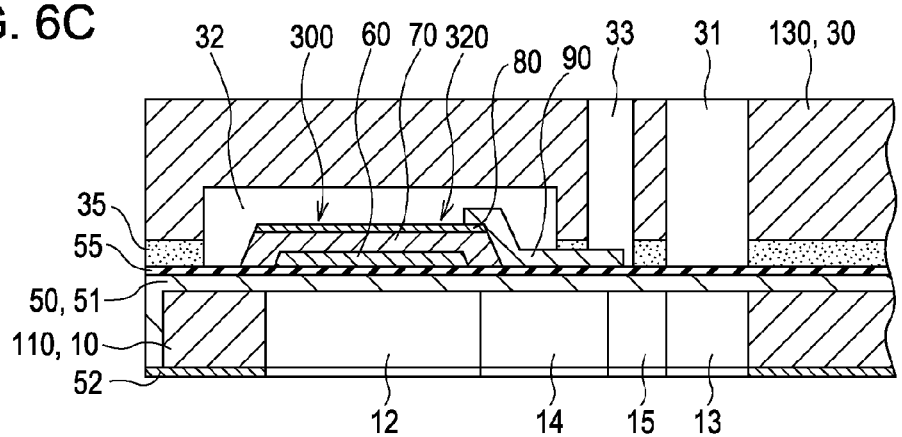

Turning to FIG. 6C, the flow channel substrate wafer 110 is subjected to anisotropic etching (wet etching) through the mask layer 52 using an alkaline solution, such as a KOH solution. Thus, pressure generating chambers 12 corresponding to the piezoelectric elements 300, a communication section 13, ink supply channels 14, and communication paths 15 are formed.

Then, unnecessary outer regions of the flow channel substrate wafer 110 and the protective substrate wafer 130 are cut away by, for example, dicing. A nozzle plate 20 having nozzle apertures 21 formed therein is bound to the surface of the flow channel substrate wafer 110 opposite to the protective substrate wafer 130, and a compliance substrate 40 is bound to the protective substrate wafer 130. The resulting flow channel substrate wafer 110 including other members is cut into chips of flow channel substrates 10 as shown in FIG. 1. Thus the ink jet recording head 1 is completed.

While the present embodiment performs the ageing before forming the pressure generating chambers 12, the ageing may be performed after forming the pressure generating chambers 12 so that the piezoelectric layer 70 satisfies the relationship $33\% \leq 2Pr/2Pm \leq 46\%$. While the piezoelectric layer 70 is allowed to satisfy the relationship $33\% \leq 2Pr/2Pm \leq 46\%$ by the ageing, the ageing is not necessarily required as long as the piezoelectric layer 70 satisfies the relationship $33\% \leq 2Pr/2Pm \leq 46\%$.

While the process of the present embodiment performs the ageing after patterning the piezoelectric elements 300 in a predetermined shape, the ageing may be performed before patterning the piezoelectric elements 300. Ageing after patterning the piezoelectric element 300 requires that a voltage be applied to the electrodes of each piezoelectric element 300. For ageing before the patterning, on the other hand, a voltage can be applied to the electrodes in a one-piece structure for the piezoelectric elements 300. In this instance, the one-piece structure for the piezoelectric elements 300 is formed as if one piezoelectric element 300 restrained other piezoelectric elements, and consequently, higher stress can be placed on the piezoelectric elements 300. While the method of the present embodiment performs the ageing after forming the leading electrodes 90 and then the protective substrate 30 is provided, the ageing may be performed before forming the leading electrodes 90 or after providing the protective substrate 30. While the method of the present embodiment applies a lower voltage for the ageing than the voltage applied in the practical use, the ageing may be performed at a voltage equal to or higher than that applied in the practical use.

Second Embodiment

Figure 7:
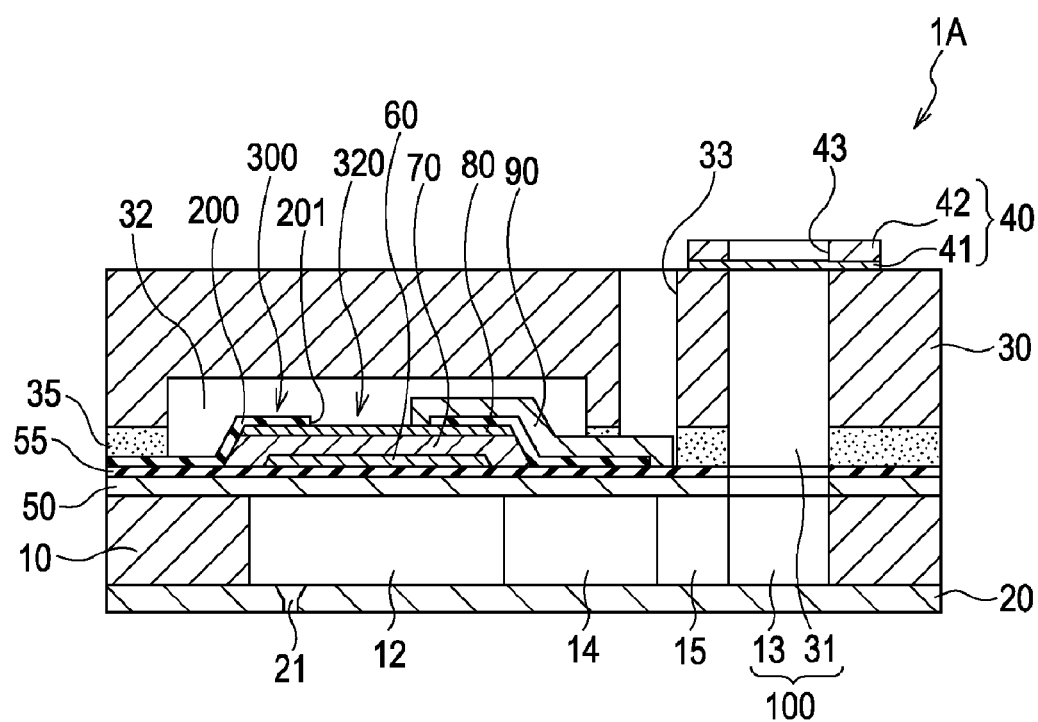
FIG. 7 is a sectional view of a recording head according to a second embodiment of the invention.

FIG. 7 is a sectional view of an ink jet recording head according to a second embodiment of the liquid ejecting head of the invention. As shown in FIG. 7, the ink jet recording head 1A of the present embodiment further includes a moisture-resistant insulating protective film 200 so as to partially cover the piezoelectric elements 300, in addition to the structure of the ink jet recording head 1 of the first embodiment. The piezoelectric layer 70 satisfies the relationship 33%≦2Pr/2Pm≦46%, as in the first embodiment. The same parts as in FIG. 2B are designated by the same reference numerals and the same description as in the first embodiment is not repeated.

The piezoelectric elements 300 in the second embodiment are partially covered with the moisture-resistant insulating protective film 200. The protective film 200 continuously disposed over the plurality of piezoelectric elements 300 so as to cover the side surfaces of the piezoelectric layers 70 and the side surfaces and the outer region of the upper surfaces of the upper electrode films 80. More specifically, the protective film has openings 201 so as not to cover the main regions, or substantially the middle regions, of the upper electrode films 80, and thus the upper electrode films 80 are exposed through the openings 201. The openings 201 each have an rectangular shape formed along the longitudinal direction of the piezoelectric element 300 and pass through the protective film 200 in the thickness direction.

The protective film 200 partially covering the piezoelectric elements 300 prevents the piezoelectric elements 300 from being destroyed by moisture in the atmosphere. The openings 201 are formed in the protective film 200 in the regions opposing the active regions of the piezoelectric elements 300, each having an inactive region not substantially operating and an active region (piezoelectric active portion 320) substantially operating, in order to prevent the operation of the piezoelectric elements 300 from being excessively impeded. Thus, high ink ejection characteristics can be maintained without suppressing the displacement of the piezoelectric elements 300. Moisture in the atmosphere easily permeates the piezoelectric elements 300 through the side surfaces. The permeation of the moisture can be almost prevented by covering the side surfaces of the piezoelectric elements with the protective film 200, and the outer regions of the upper surfaces of the piezoelectric elements 300 are not necessarily covered with the protective film 200.

The protective film 200 is preferably made of an inorganic amorphous insulating material, such as silicon oxide ($SiO_x$), tantalum oxide ($TaO_x$), or aluminium oxides ($AlO_x$).

Leading electrodes 90 are disposed on the protective film 200. One ends of the leading electrodes 90 are connected to the respective upper electrode films 80, and the other ends are extended to the ink supply channels 14 of the flow channel substrate 10. The end of the extension of the leading electrode 90 is connected to the driving circuit operating the piezoelectric element 300 with a connection wire.

Figure 8A:
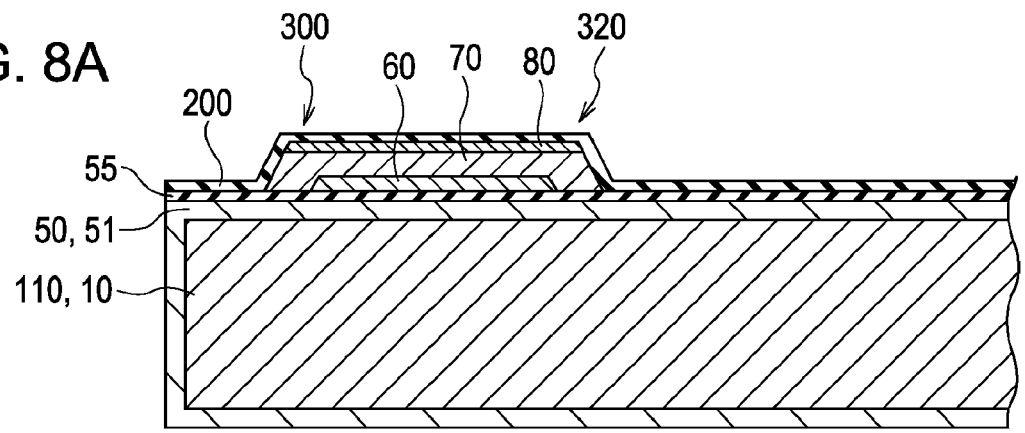
FIGS. 8A to 8C are sectional views of steps in a method for manufacturing the recording head according to the second embodiment.
Figure 8B:
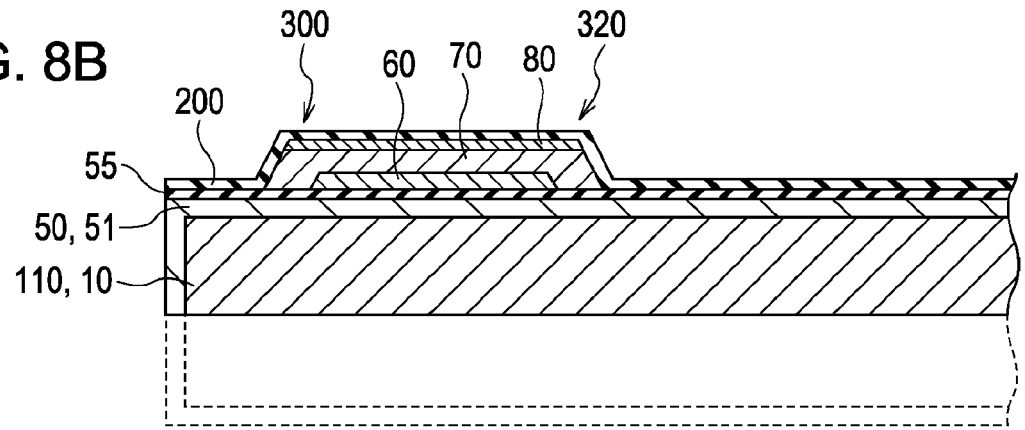
Figure 8C:
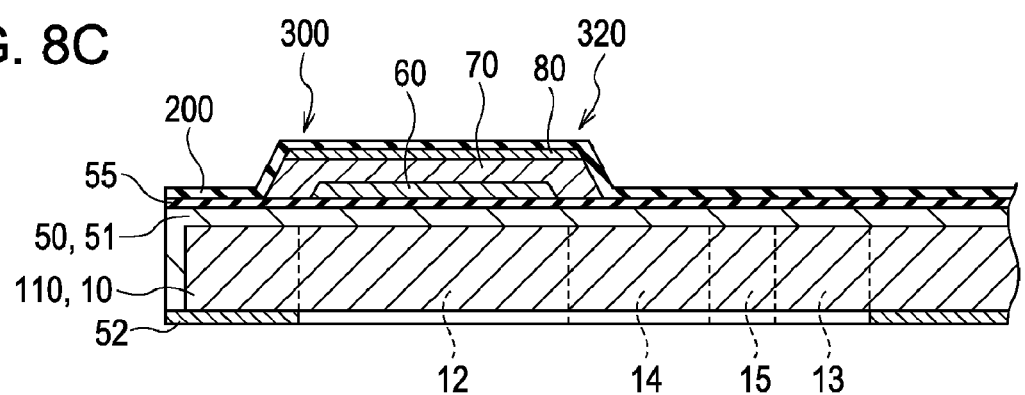
Figure 9A:
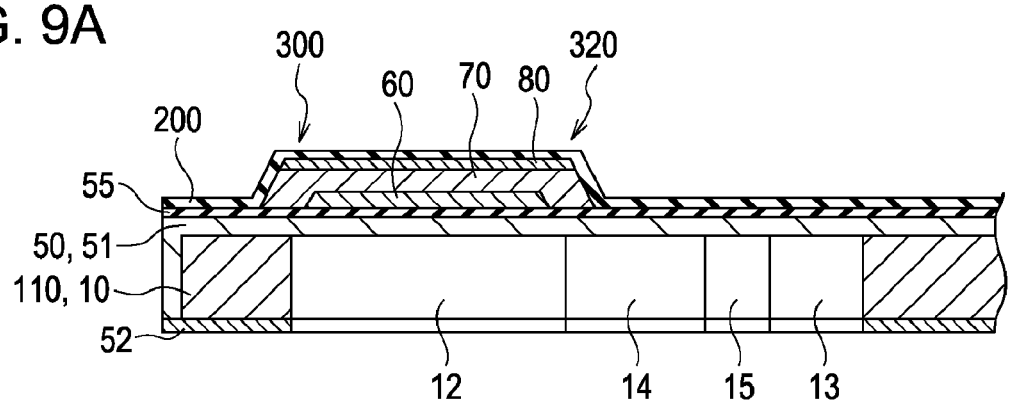
FIGS. 9A to 9C are sectional views of steps in the method for manufacturing the recording head according to the second embodiment.

The method for manufacturing the ink jet recording head 1A of the second embodiment will now be described with reference to FIGS. 8A to 9C. In this method, after the piezoelectric elements 300 are prepared in the same manner as in the first embodiment (FIGS. 4A to 5B), the protective film 200 is formed over the entire surface of the flow channel substrate wafer 110, as shown in FIG. 8A(a). Then, the thickness of the flow channel substrate wafer 110 is reduced to a predetermined thickness, as shown in FIG. 8B, and a mask layer 52 is formed on the flow channel substrate wafer 110, followed by patterning into a predetermined shape as shown in FIG. 8C. Turning to FIG. 9A, the flow channel substrate wafer 110 is subjected to anisotropic etching (wet etching) using an alkaline solution, such as KOH, through the mask layer 52. Thus, the pressure generating chambers 12 corresponding to the respective piezoelectric elements 300, the communication section 13, the ink supply channels 14, and the communication paths 15 are formed in the flow channel substrate wafer 110.

Then, as in the first embodiment, a driving signal is applied to the piezoelectric element 300 to perform ageing at a lower driving voltage than the driving voltage applied in the practical use, thereby adjusting the piezoelectric layer 70 to satisfy the relationship 33%≦2Pr/2Pm≦46%. By appropriately selecting the ageing conditions including the driving voltage and operation time, and the thickness of the protective film 200, the piezoelectric layer 70 is adjusted to satisfy the relationship 33%≦2Pr/2Pm≦46%. Thus, the displacement of the piezoelectric element 300 can be reliably prevented from decreasing in the practical use. The 2Pr/2Pm value of the piezoelectric layer 70 may be less than 33% before ageing. In the present embodiment, the ageing is performed after forming the protective film 200 so as to partially cover the piezoelectric elements 300 and before forming the openings 201 in the protective film 200, that is, in the stage shown in FIG. 9A. The protective film 200 before being provided with the openings 201 corresponds to the "restraining member".

When a driving signal is applied to the piezoelectric element 300 partially covered with the protective film 200 to operate the piezoelectric element 300, the piezoelectric layer 70 is contracting, but the piezoelectric element 300 is secured to be restrained by the protective film 200. Thus, the displacement of the piezoelectric element 300 is more restrained by the protective film 200 during ageing than in the practical use, in which the openings 201 are formed in the protective film 200 in the regions corresponding to the upper electrode films 80. Consequently, a higher tensile stress than in the practical use is placed on the piezoelectric element 300 during the ageing. Since the polarization of the piezoelectric material can be fixed by performing ageing with a higher tensile stress than in the practical use placed on the piezoelectric element 300, the voltage applied to the piezoelectric element 300 for sufficient ageing can be lower than the voltage applied in the practical use.

The piezoelectric layer 70 is less deformed as in the practical use by the ageing performed at a lower voltage than the voltage applied in the practical use. Accordingly, the variation of displacement of the piezoelectric element 300 can be reduced without forming a crack in the piezoelectric layer 70 during the ageing. Thus, the resulting ink jet recording head can exhibit stable ink ejection characteristics. Since the deformation of the vibration plate is also reduced more than in the practical use, the vibration plate can be prevented from cracking during the ageing. In addition, ageing performed at a low voltage can prevent the piezoelectric layer 70 from being excessively damaged, and thus eliminate the problem that the piezoelectric element 300 cannot be displaced. Furthermore, the ageing time can be reduced, and accordingly the load on the piezoelectric element 300 can be reduced by performing the ageing in a shorter time. Also, since a member of the ink jet recording head 1A before being formed into the final form used in the ink jet recording head 1A, such as the protective film 200 before being provided with the openings 201, is used for the ageing, additional members are not required, and ageing can be performed more efficiently than ever.

Figure 9B:
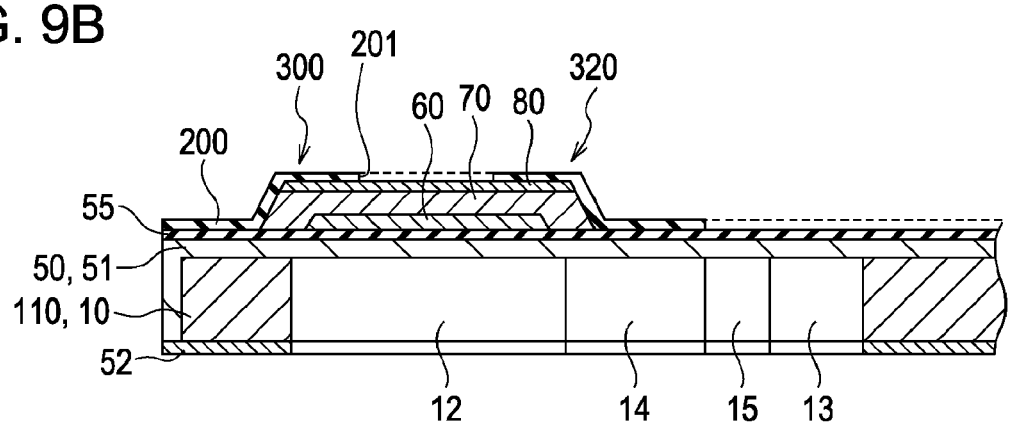

After the ageing, the regions of the protective film 200 corresponding to the piezoelectric elements 300 are selectively dry-etched by, for example, ion milling or reactive dry etching to form the openings 201 in the protective film 200 in the regions corresponding to the upper electrode films 80, as shown in FIG. 9B. Accordingly, the protective film 200 is preferably made of a material capable of being easily removed to form the openings 201.

Figure 9C:
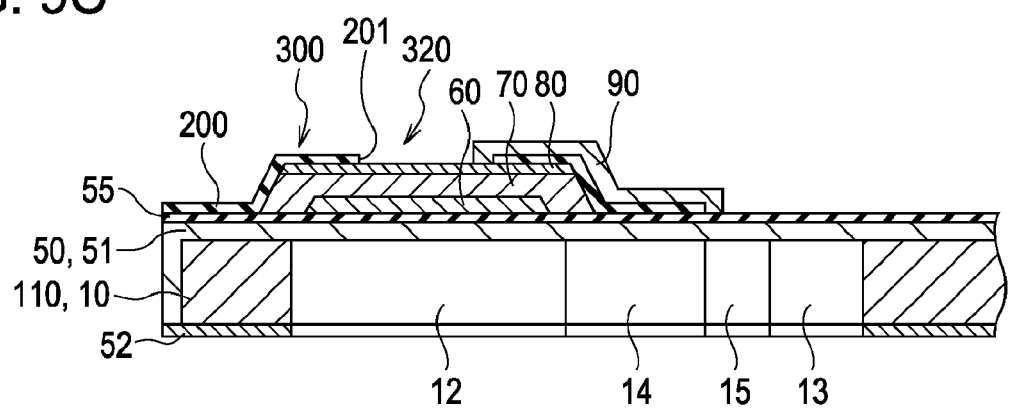

Turning to FIG. 9C, after forming the leading electrodes 90, a silicon protective substrate wafer 130 intended for a plurality of protective substrates 30 is bonded to the surface of the flow channel substrate wafer 110 having the piezoelectric elements 300 with an adhesive, in the same manner as in the first embodiment. Then, unnecessary outer regions of the flow channel substrate wafer 110 and the protective substrate wafer 130 are cut away by, for example, dicing. A nozzle plate 20 having nozzle apertures 21 formed therein is bound to the surface of the flow channel substrate wafer 110 opposite to the protective substrate wafer 130, and a compliance substrate 40 is bound to the protective substrate wafer 130. The resulting flow channel substrate wafer 110 including other members is cut into chips of flow channel substrates 10 as shown in FIG. 1. Thus the ink jet recording head 1A is completed.

While the present embodiment performs the ageing after forming the pressure generating chambers 12, the ageing may be performed before forming the pressure generating chambers 12. Ageing performed after forming the protective film 200 and before forming the pressure generating chambers 12 can apply a higher tensile stress to the piezoelectric element 300, and accordingly the ageing can be sufficiently performed at a lower applied voltage.

While the protective film 200 used in the present embodiment is made of a moisture-resistant material, the material is not particularly limited as long as it can restrain the displacement of the piezoelectric element 300 during ageing. While the present embodiment performs ageing in a state where the protective film 200 is disposed over the entire surface of the flow channel substrate, the protective film 200 may be disposed so as to cover at least the surfaces of the piezoelectric layers 70 of the piezoelectric elements 300 and provided individually for each piezoelectric element 300, and the ageing may be performed in this state. While the present embodiment forms the openings 201 in the protective film 200 after the ageing and the resulting protective film is used for resistance to moisture, the protective film 200 may be removed after the ageing. If the protective film 200 is removed, the resulting ink jet recording head 1A has the same structure as the ink jet recording heat of the first embodiment.

The second embodiment will be further described in detail with reference to Examples.

Examples

Eight ink jet recording heads were prepared according to the second embodiment. Each ink jet heat includes a 2 μm thick elastic film ($SiO_2$), a 0.4 μm thick insulating film ($ZrO_2$), and piezoelectric elements each including a 0.2 μm thick iridium lower electrode film, a 1.2 μm thick PZT piezoelectric layer, and a 0.05 μm thick platinum upper electrode film. The pressure generating chamber had a length shown in Table 1. The protective film was made of alumina to a thickness of 100 nm. The piezoelectric elements partially covered with the protective film were subjected to ageing before forming the pressure generating chambers. The piezoelectric layer and the vibration plate were not cracked by the ageing.

The piezoelectric layer of each ink jet recording head had a rhombohedral crystal structure preferentially oriented to the (100) plane. The residual polarization Pr and the saturated polarization Pm were measured by applying a voltage of 35V DC to the piezoelectric elements of the ink jet recording head. The results are shown in Table 1. As shown in Table 1, the piezoelectric layers of the ink jet recording heads of the Examples satisfy the relationship 33%≦2Pr/2Pm≦46%. These ink jet recording heads are designated as Examples 1 to 8.

Comparative Example

Nine ink jet recording heads were prepared in the same manner as in the above Examples except that ageing was not performed. The piezoelectric layer of each ink jet recording head had a rhombohedral crystal structure preferentially oriented to the (100) plane. The residual polarization Pr and the saturated polarization Pm were measured by applying a voltage of 35 V DC to the piezoelectric elements. The results are shown in Table 1. As shown in Table 1, the 2Pr/2Pm values of the piezoelectric layers were less than 33%. These ink jet recording heads are designated as Comparative Examples 1 to 9.

Experimental Examples

Predetermined driving pulses were continuously applied 19 billion times to each ink jet recording head of the Examples and the Comparative Examples for an endurance test, and the reduction of the displacement of the piezoelectric elements after applying the pulses from the displacement before applying the pulses was measured. The results are shown in Table 1 and FIG. 10. The driving pulses applied to the piezoelectric elements for endurance test have sinusoidal waveforms of 50 V in voltage and 100 kHz in frequency, and the driving pulses applied for measuring displacement have trapezoidal waveforms of 30 V in voltage and 800 Hz in frequency.

TABLE 1

| | Pressure generating chamber width (μm) | Pm+ | 2Pr | 2Pr/2Pm(%) | Displacement reduction (%) |
|---|---|---|---|---|---|
| Comparative Example 1 | 57 | 44.9 | 28.2 | 31.39 | −16.7 |
| Comparative Example 2 | 57 | 44.2 | 25.9 | 29.28 | −14.4 |
| Comparative Example 3 | 57 | 45.0 | 27.0 | 30.01 | −12.6 |
| Comparative Example 4 | 57.5 | 45.0 | 29.1 | 32.28 | −12.4 |
| Comparative Example 5 | 58 | 44.7 | 28.0 | 31.34 | −12.3 |
| Comparative Example 6 | 57.5 | 45.8 | 29.1 | 31.82 | −11.6 |
| Comparative Example 7 | 57 | 44.5 | 27.1 | 30.51 | −11.6 |
| Comparative Example 8 | 57 | 45.0 | 26.9 | 29.90 | −11.1 |
| Comparative Example 9 | 57 | 43.8 | 28.2 | 32.12 | −10.7 |

TABLE 1-continued

|  | Pressure generating chamber width (μm) | Pm+ | 2Pr | 2Pr/2Pm(%) | Displacement reduction (%) |
|---|---|---|---|---|---|
| Example 1 | 57 | 44.6 | 31.7 | 35.62 | −4.0 |
| Example 2 | 57 | 43.7 | 31.3 | 35.77 | −4.0 |
| Example 3 | 57 | 44.6 | 32.0 | 35.85 | −3.9 |
| Example 4 | 57.5 | 44.6 | 33.3 | 37.29 | −3.7 |
| Example 5 | 58 | 44.2 | 31.9 | 36.12 | −3.2 |
| Example 6 | 57 | 43.9 | 29.5 | 33.53 | −1.3 |
| Example 7 | 57 | 44.8 | 32.7 | 36.47 | −1.1 |
| Example 8 | 57 | 43.5 | 31.7 | 36.45 | 3.2 |

Figure 10:
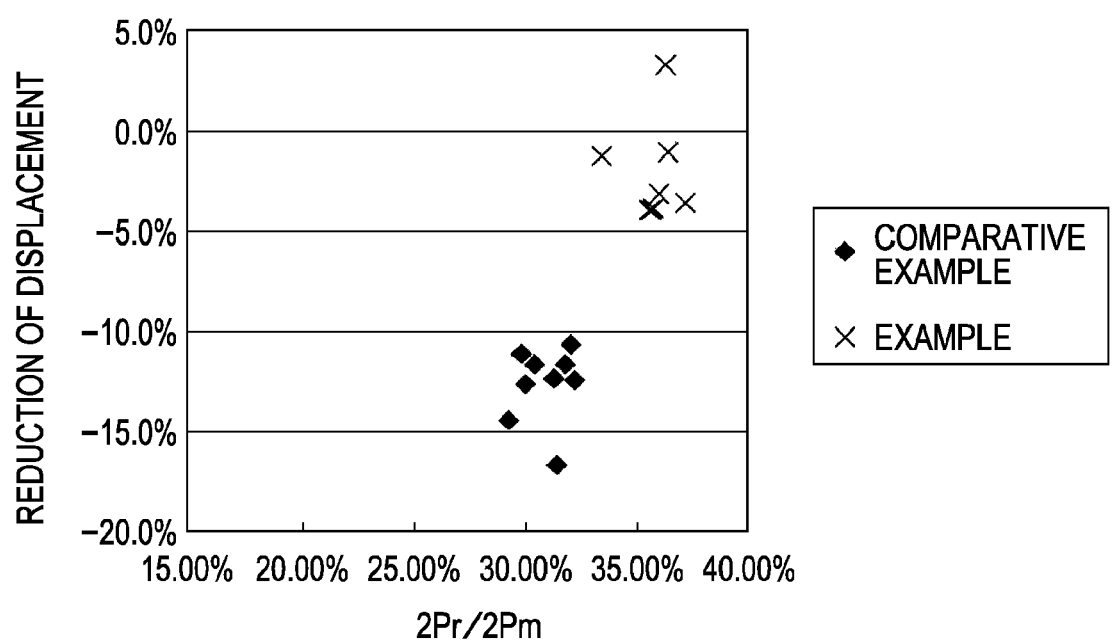
FIG. 10 is a plot of test results.

As shown in Table 1 and FIG. 10, in the ink jet recording heads of Examples 1 to 8, whose piezoelectric layers satisfy the relationship 33%≦2Pr/2Pm≦46% before the endurance test, the reduction of the displacement of the piezoelectric elements was within 4%. In contrast, in the ink jet recording heads of Comparative Examples 1 to 9, whose piezoelectric layers had 2Pr/2Pm values of less than 33%, the reduction of the displacement of the piezoelectric elements was 10% or more and was much higher than that of the Examples. The 2Pr/2Pm values of the Examples and Comparative Examples were each 46% or less before endurance test, and the displacements of those ink jet recording heads were as sufficient as 340 nm or more.

Other Embodiments

While the invention has been described with reference to exemplary embodiments, it is to be understood that the invention is not limited to the disclosed exemplary embodiments. While, for example, the above embodiments illustrate low-profile ink jet recording heads manufactured by deposition and lithography, the ink jet recording head is not limited to such low-profile types. For example, the ink jet recording head may be of thick type produced by, for example, stacking green sheets.

while the invention has been described using ink jet recording heads that eject ink as exemplary embodiments of the liquid ejecting head of the invention, the invention is not limited to the ink jet recording head and is intended for liquid-ejecting heads in general. Such liquid ejecting heads include recording heads used in image recording apparatuses, such as printers, color material ejecting heads used for manufacturing color filters of liquid crystal displays, electrode material ejecting heads used for forming electrodes of organic EL displays, field emission displays (FED's) and so forth, and bioorganic material ejecting heads used for manufacturing biochips.

What is claimed is:
1. A liquid ejecting head comprising:
 a flow channel substrate having a pressure generating chamber communicating with a nozzle aperture through which liquid is ejected; and
 a piezoelectric element disposed on one surface of the flow channel substrate, the piezoelectric element including a common electrode, a piezoelectric layer, and an individual electrode, the piezoelectric layer being made of lead zirconate titanate having a rhombohedral or monoclinic crystal structure preferentially oriented in the (100) plane, the piezoelectric layer satisfying the relationship 33%≦2Pr/2Pm≦46%, wherein Pm represents the saturated polarization of the piezoelectric layer and Pr represents the residual polarization of the piezoelectric layer.

2. The liquid ejecting head according to claim 1, wherein the piezoelectric layer has a thickness in the range of 1 to 5 μm.

3. A method for manufacturing a liquid ejecting head including a flow channel substrate having a pressure generating chamber communicating with a nozzle aperture through which liquid is ejected, and a piezoelectric element disposed on one surface of the flow channel substrate and including a common electrode, a piezoelectric layer made of lead zirconate titanate having a rhombohedral or monoclinic crystal structure preferentially oriented in the (100) plane, and an individual electrode, the method comprising:
 forming the piezoelectric element on the flow channel substrate;
 ageing the piezoelectric element by applying a driving signal to the piezoelectric element to operate the piezoelectric element, thereby adjusting the saturated polarization Pm and the residual polarization Pr of the piezoelectric layer to satisfy the relationship 33%≦2Pr/2Pm≦46%; and
 forming the pressure generating chamber in the flow channel substrate.

4. The method according to claim 3, wherein the ageing is performed with a restraining member restraining the displacement of the piezoelectric element more tightly than the state of the displacement of the piezoelectric element in the practical use.

5. The method according to claim 4, wherein the ageing is performed before forming the pressure generating chamber, and the flow channel substrate serves as the restraining member during the ageing.

6. The method according to claim 4, further comprising forming a protective film so as to partially cover the piezoelectric element after forming the piezoelectric element, the protective film serving as the restraining member during the ageing.

7. The method according to claim 6, further comprising forming a recess in the protective film in a region opposing the upper electrode after the ageing.

8. The method according to claim 4, wherein in the ageing, a driving signal is applied to the piezoelectric element so that the ageing is performed at a lower driving voltage than the driving voltage applied in the practical use.

* * * * *